(12) United States Patent  (10) Patent No.: US 8,368,163 B2
Krause et al.  (45) Date of Patent: Feb. 5, 2013

(54) SEMICONDUCTOR COMPONENT WITH CONTACTS MADE OF ALLOYED-IN METAL WIRES

(75) Inventors: Andreas Krause, Dresden (DE); Martin Kutzer, Penig (DE); Michael Heemeier, Dresden (DE); Alexander Fülle, Kirchberg (DE); Holger Neuhaus, Freiberg (DE)

(73) Assignee: SolarWorld Innovations GmbH, Freiberg (DE)

( * ) Notice: Subject to any disclaimer, the term of this patent is extended or adjusted under 35 U.S.C. 154(b) by 636 days.

(21) Appl. No.: 12/566,981

(22) Filed: Sep. 25, 2009

(65) Prior Publication Data

US 2010/0078073 A1  Apr. 1, 2010

(30) Foreign Application Priority Data

Sep. 27, 2008 (DE) .................. 10 2008 049 220

(51) Int. Cl.
*H01L 31/00* (2006.01)
(52) U.S. Cl. .......... 257/459; 257/E31.001; 257/E31.124

(58) Field of Classification Search .................. 257/459, 257/E31.001, E31.124, E27.124, E27.125, 257/E27.126, E25.007, E25.009; 136/244, 136/256, 261, 206

See application file for complete search history.

(56) References Cited

U.S. PATENT DOCUMENTS

| 4,260,429 A | 4/1981 | Moyer |
| 5,543,333 A * | 8/1996 | Holdermann .................. 438/97 |
| 5,681,402 A | 10/1997 | Ichinose et al. |
| 6,515,218 B1 | 2/2003 | Shimizu et al. |
| 2001/0040293 A1 * | 11/2001 | Meikle et al. .................. 257/751 |
| 2007/0107773 A1 * | 5/2007 | Fork et al. ...................... 136/256 |
| 2010/0059109 A1 * | 3/2010 | Nakayashiki et al. ........ 136/255 |
| 2010/0133520 A1 * | 6/2010 | Bressers et al. .................. 257/40 |

FOREIGN PATENT DOCUMENTS

| DE | 195 29 306 A1 | 2/1997 |
| EP | 0 684 652 A2 | 11/1995 |
| EP | 1 772 907 A2 | 4/2007 |

\* cited by examiner

*Primary Examiner* — Cuong Q Nguyen
*Assistant Examiner* — Yosef Gebreyesus
(74) *Attorney, Agent, or Firm* — McGlew and Tuttle, P.C.

(57) ABSTRACT

A semiconductor component, especially a solar cell comprises a semiconductor substrate of a planar design having a first side and a second side lying opposite thereto, at least one contact structure arranged on at least one side of the semiconductor substrate, the at least one contact structure exhibiting a diffusion barrier to prevent the diffusion of ions from the contact structure into the semiconductor substrate.

20 Claims, 8 Drawing Sheets

SEMICONDUCTOR COMPONENT WITH CONTACTS MADE OF ALLOYED-IN METAL WIRES

FIELD OF THE INTENTION

The invention relates to a semiconductor component, a semiconductor module with at least two semiconductor components and a method for manufacturing such a semiconductor component.

BACKGROUND ART

Solar cells normally have a front side and a rear side, with a contact structure being applied on at least one of the two sides. The contact structure typically has a width of at least 100 μm, while its thickness is only about 10 to 15 μm. A greater width of the contact structure leads to a reduction in efficiency because of the increased shading that results. Conversely, a decrease of the width of the contact structure leads to an increase in the line resistances of the contact structure.

SUMMARY OF THE INVENTION

The invention is therefore based on the object of creating a semiconductor component with an improved contact structure. The invention is also based on the object of providing a method for manufacturing such a semiconductor component.

Said object is achieved by a semiconductor component, especially a solar cell, comprising a semiconductor substrate of a planar design having a first side and a second side lying opposite thereto, at least one contact structure arranged on at least one side of the semiconductor substrate, and the at least one contact structure comprising a diffusion barrier to prevent the diffusion of ions from the contact structure into the semiconductor substrate. The object is further achieved by a semiconductor module comprising at least two semiconductor components being electrically conductively connected by means of at least one of the contact structures, and a method for manucaturing a semiconductor component comprising the steps of providing a semiconductor substrate of a planar design having a first side and a second side lying opposite thereto, providing a contact structure having a diffusion barrier to prevent the diffusion of ions from the contact structure into the semiconductor substrate, arranging the contact structure on at least one of the sides of the semiconductor substrate and heating, at least in some areas, the semiconductor substrate and the contact structure to produce an electrically conductive connection between the semiconductor substrate and the contact structure. The core of the invention consists in designing the contact structure for a semiconductor component as an electrically well conductive metal wire with at least one diffusion barrier coating, the coating of contact structure forming, at least in some areas, an alloy with the semiconductor substrate to form an electrical contact.

Owing to the high electrical conductivity, the cross-sectional surface area of the contact structure can be significantly reduced, which becomes noticeable as reduced shading, with a simultaneous reduction of the resistance losses. This improves the efficiency of the semiconductor component. Moreover, the material costs of the contact structure according to the present invention are significantly reduced when compared with the usual contact structures. Further advantages result from the sub-claims.

Features and details of the invention result from the description of a plurality of embodiments based on the drawings.

DESCRIPTION OF THE PREFERRED EMBODIMENTS

Figure 1:
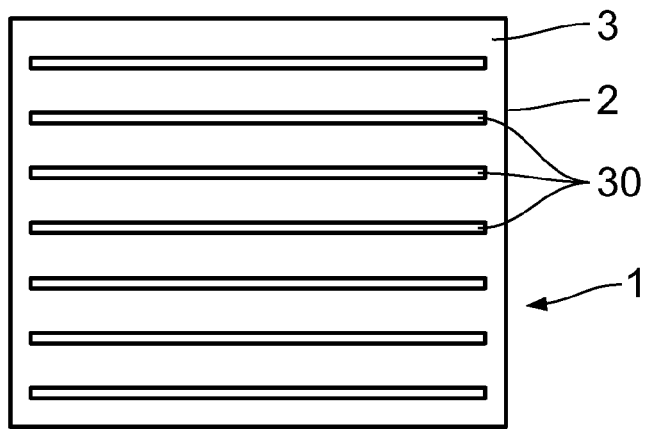
FIG. 1 a top view onto a semiconductor component according to a first embodiment, FIG. 2 a schematic sectional representation of a section of the semiconductor component according to FIG. 1, FIG. 3 a representation according to FIG. 2 of a semiconductor component according to a second embodiment, FIG. 4 a cross-section of a contact structure according to the present invention according to a third embodiment, FIG. 5 a representation according to FIG. 2 of a semiconductor component according to a fourth embodiment, FIGS. 6 to 8 different alternatives and views of a semiconductor component according to a fifth embodiment, FIG. 9 a schematic representation of a semiconductor module according to the present invention, FIGS. 10 and 11 a schematic representation of the method for manufacturing the semiconductor component according to one of the embodiments, FIG. 12 a schematic representation of another method, according to the present invention, for manufacturing the semiconductor component according to one of the embodiments, FIG. 13 a sectional representation of the pressing-on roller used for the method according to FIG. 12, and FIG. 14 a schematic representation of a third method, according to the present invention, for manufacturing the semiconductor component according to one of the embodiments.
Figure 2:
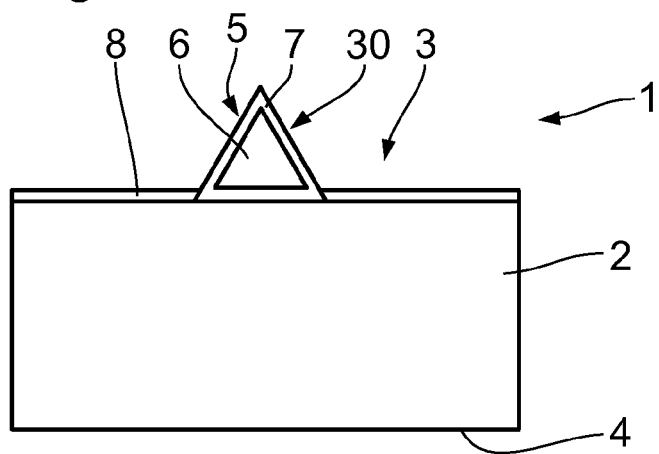

In the following, a first embodiment of the invention is described with reference to FIGS. 1 and 2. A semiconductor component 1 especially designed as a solar cell comprises a semiconductor substrate 2 of a planar design, especially made of silicon, preferably p-doped silicon. The semiconductor substrate 2 can, however, also be made of another semiconductor material. The semiconductor substrate 2 exhibits a first side designed as a front side 3 and a second side designed as a rear side 4 lying opposite thereto.

Moreover, the semiconductor component 1 comprises a contact structure 5 arranged on the front side 3. The contact structure 5 is formed by several metal wires 30, especially copper wires. The metal wires 30 of the contact structure 5 are especially arranged in parallel to each other. They each exhibit a metallic core 6, which is coated with a diffusion barrier 7. The core 6 is made of a material with a high specific conductance of at least 30 MS/m, especially at least 45 MS/m, preferable at least at least 55 MS/m.

The core 6 preferably contains at least some copper. The copper content of the core 6 is preferably at least 50%, especially at least 70%, especially at least 90%. As an alternative, the core 6 can exhibit a corresponding content of silver or of a silver-containing alloy. The core 6 has a polygonal, especially a triangular or quadrangular, or a round, especially circular or elliptical cross-section. The cross-section has a cross-sectional surface area, Q, in the range of 50 μm² to 20,000 μm², especially in the range of 700 μm² to 12,000 μm², preferably in the range of 1,500 μm² to 7,000 μm². The diffusion barrier 7 has a thickness in the range of 1 μm to 10 μm, especially in the range of 3 μm to 6 μm. The contact structure 5 thus has a line resistance, $R_1$, in the range of 1 Ω/m to 600 Ω/m, especially less than 100 Ω/m, especially less than 20 Ω/m, especially less than 10 Ω/m, preferably less than 3 Ω/m.

The diffusion barrier 7 is made of a material, especially a metal, which has a negligible diffusion coefficient and a negligible mixability as regards the material of the core 6. It serves to prevent the diffusion of ions from the contact structure 5 into the semiconductor substrate 2.

The diffusion barrier 7 contains at least some cobalt and/or nickel and/or silver and/or a compound of said elements. It is especially made of cobalt or nickel. The diffusion barrier 7 is alloyed into the semiconductor substrate 2, at least in some areas. The alloy is especially nickel or cobalt silicide. This way, a low contact resistance between the contact structure 5 and the semiconductor substrate 2 is realised.

Owing to the high electrical conductivity of the contact structure 5, it is possible to dispense with busbars extending vertically thereto on the semiconductor substrate 2. The semiconductor substrate 2 is thus busbar-free. This reduces shading and thus increases efficiency.

Other contacts on the rear side 4 of the semiconductor substrate 2, which are not explicitly shown in the figures, can be designed as screen-printed contacts, laser-fired contacts or according to the contact structure 5 on the front side 3.

Finally, the semiconductor component 1 exhibits a protective layer 8. The protective layer 8 is especially made of silicon nitride or silicon dioxide. It also serves as an anti-reflective layer.

Figure 9:
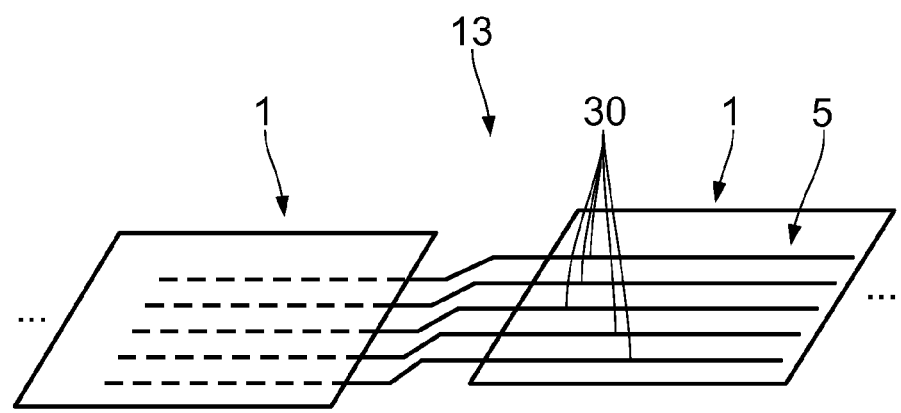
Figure 10:
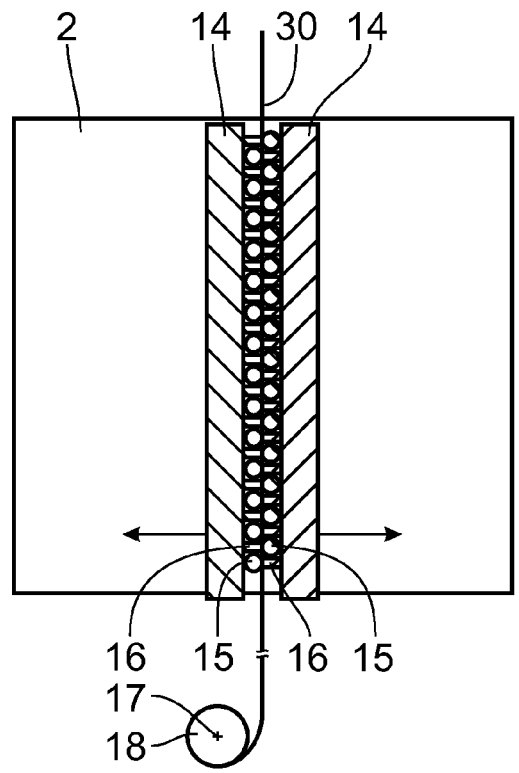
Figure 11:
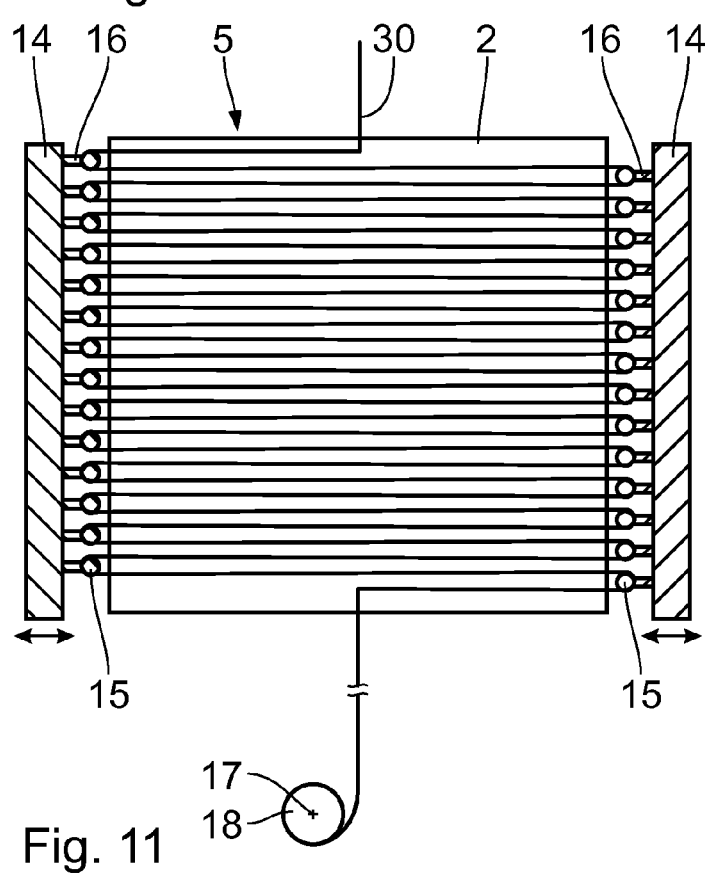

In the following, a method for manufacturing the semiconductor component 1 is described with reference to FIGS. 9 and 10. First, the semiconductor substrate 2 is provided, and the wire 30 with the metallic core 6 and the diffusion barrier 7, which forms the contact structure 5, is arranged on the front side 3. An arrangement on the rear side 4 is, of course, also possible. To achieve a meander-shaped arrangement of the wire 30 on the front side 3 of the semiconductor substrate 2, the wire 30 is placed between two combs 14 pushed into one another, with the wire 30 running over deflection rollers 15, each of which is rotatably disposed at the end of a tooth 16 of the comb 14. By drawing apart the combs 14 parallel to the front side 3 of the semiconductor substrate 2, the wire 30 is brought into a meander shape, the wire 30 being unrolled from a roller 18 rotatably disposed around a rotational axis 17.

The wire 30 forming the contact structure 5 is directly applied onto the semiconductor substrate 2. Thereafter, the semiconductor substrate 2 and the contact structure 5 are heated to form an electrically conductive connection. By heating up to an alloying temperature, $T_L$, in the range of 300° C. to 900° C., an alloy is formed at the phase boundary between the diffusion barrier 7 and the semiconductor substrate 2, i.e. the diffusion barrier 7 is alloyed into the semiconductor substrate 2. The alloy is especially cobalt silicide or nickel silicide or a silver silicon alloy. The alloy has a high electrical conductivity and forms an electrically conductive connection between the semiconductor substrate 2 and the contact structure 5 with a low contact resistance.

Formation of the alloy is promoted by slightly pressing the contact structure 5 onto the semiconductor substrate 2 during the heating. To ensure the contact structure 5 is pressed evenly onto the front side 3 of the semiconductor substrate 2, it is advantageous to place the semiconductor substrate 2 onto a slightly convexly arched surface and to stretch the meander-shaped contact structure 5 over the semiconductor substrate 2.

The heating for the alloying-in of the contact structure 5 can occur by means of a flash lamp, by conductive heating of the contact structure 5, in a continuous furnace, by means of a laser or through a heated support surface.

After the alloying-in of the contact structure 5 into the front side 3 of the semiconductor substrate 2, the protective layer 8 serving as an anti-reflective layer is also applied onto the semiconductor substrate 2. For this, a low-temperature process is envisaged, which leaves the alloy between the contact structure 5 and the semiconductor substrate 2 intact.

Alternatively, it is possible to provide the semiconductor substrate 2 with the protective layer 8 already before the application of the contact structure 5. In this case the protective layer 8 is opened up in areas before or during the application of the contact structure 5. For this, a laser process or an etching process is preferably envisaged. In the case of the etching process, phosphoric acid-containing etching pastes and/or fluoride-containing etching pastes and/or hydrofluoric acid-containing solutions are used to open up the protective layer. According to the present invention it is envisaged to carry out the etching process directly before the heating of the contact structure 5 to perform the formation the alloy between it and the semiconductor substrate 2. Preferably, the contact structure 5 and/or the protective layer 8 on the semiconductor substrate 2 are coated with an etching paste across the entire surface. Next, the contact structure 5 is applied onto the front side 3 of the semiconductor substrate 2 with the etching paste-coated protective layer 8. By selective heating of the contact structure 5, for example by means of a laser and/or by conductive heating, a selective etching process takes place on the contact surface between the contact structure 5 and the semiconductor substrate 2. This way, a disadvantageous positioning of the wire 30 is avoided.

Figure 3:
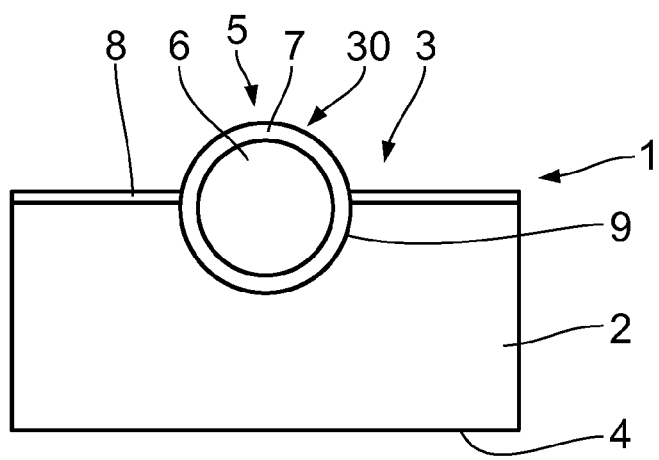

In the following, a second embodiment of the invention is described with reference to FIG. 3. Identical parts receive the same reference number as for the embodiment according to FIG. 2, reference to the description of which is hereby made. The difference to the embodiment according to FIG. 2 consists in that the contact structure 5 is arranged in a recess 9 in the semiconductor substrate 2 and/or in the protective layer 8. This increases the contact surface between the contact structure 5 and the semiconductor substrate 2. In this embodiment, the contact structure 5 preferably has a cross-section that is adapted to the recesses 9. Advantageously this is a round cross-section. In the area of the recess 9 the semiconductor substrate 2 preferably exhibits a higher doping with a dopant, especially phosphorous or boron.

The recess exhibits a depth which preferably corresponds to the radius of the wire 30. The wire 30 is thus arranged in the recess 9 with at least 30%, especially at least 40%, especially at least 50% of its cross-sectional surface area.

Figure 4:
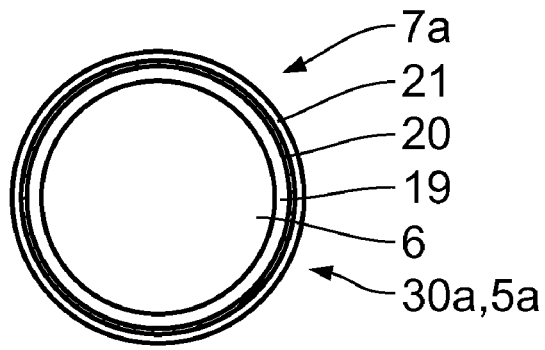

In the following, a third embodiment of the contact structure 5 is described with reference to FIG. 4. Identical parts receive the same reference number as for the first embodiment, reference to the description of which is hereby made. Parts that are functionally the same but of a different design receive the same reference number followed by an 'a'. The difference to the first embodiment consists in that the diffusion barrier 7a has a multi-layer design. It comprises a first diffusion barrier layer 19, a second diffusion barrier layer 20 and a third diffusion barrier layer 21. The three diffusion barrier layers 19, 20, 21 together form diffusion barrier 7a.

The most inner, first diffusion barrier layer 19 has a thickness in the range of 1 μm to 10 μm. It is advantageously made of nickel and/or cobalt and/or a compound of said elements.

The most outer, third diffusion barrier layer 21 is preferably made of nickel and/or cobalt and/or a compound of said elements, but it can also at least partly be of silver or antimony. It exhibits a thickness in the range of 10 nm to 200 nm.

The middle, second diffusion barrier layer 20 is made of a material, which on the one hand exhibits a low diffusion coefficient with regard to the material of the first and third diffusion barrier layer 19, 21, on the other hand has no affinity to the material of the semiconductor substrate 2 and a low diffusion coefficient with regard to this material. The second diffusion barrier layer 20 is especially made of molybdenum and/or tungsten and/or rhenium and/or a compound of said elements. To the extent that the second diffusion barrier layer 20 also forms a diffusion barrier for the material of the core 6 of the contact structure 5a, it is possible to dispense with the first diffusion barrier layer 19. This is the case, for example, for a core 6 made of copper and a second diffusion barrier layer 20 made of molybdenum.

During the alloying-in of the contact structure 5a into the semiconductor substrate 2, the second diffusion barrier layer 20 ensures that the thickness of the alloy between the diffusion barrier 7a and the semiconductor substrate 2 does not exceed a predefined thickness. For this embodiment, the formation of an alloy occurs exclusively in the outer third diffusion barrier layer 21. It reaches exactly to the second diffusion barrier layer 20. Thus, the thickness of the alloy can be regulated via the thickness of the third diffusion barrier layer 21. This especially prevents penetration of the emitter during the alloy formation and thus a short circuit between the emitter and the base.

Figure 5:
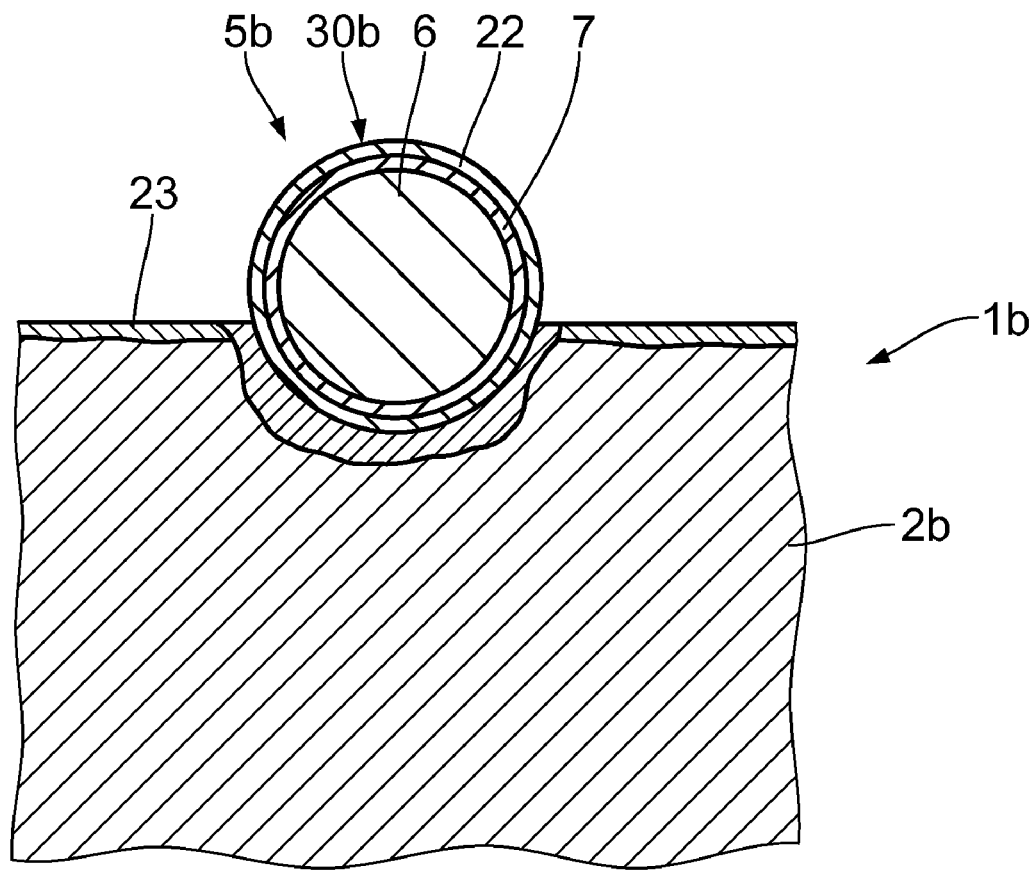

In the following, a forth embodiment of the invention is described with reference to FIG. 5. Identical parts receive the same reference number as for the first embodiment, reference to the description of which is hereby made. Parts that are of a different design but functionally the same receive the same reference number followed by a 'b'. On semiconductor component 1b the semiconductor substrate 2b is n-doped. Accordingly, the contact structure 5b exhibits a coating 22, especially made of aluminium, for connection with the semiconductor substrate 2b. To establish an electrical connection between the contact structure 5b and the semiconductor substrate 2b, they undergo heat treatment at a temperature $T_{WB}$, the temperature $T_{WB}$ lying between the eutectic temperature of an aluminium-silicon alloy and the melting temperature of aluminium, i.e. $577° C. \leq T_{WB} \leq 660° C$. As a result of the heat treatment there forms a molten phase comprising the coating 22 and the semiconductor substrate 2b. During the cooling down to room temperature, the arrangement of the contact structure 5b on the semiconductor substrate 2b exhibits an excellent mechanical stability.

Through the coating 22, which is made of trivalent aluminium, a local high doping is achieved in the immediate vicinity of the contact structure 5b. This way it is possible to diffuse a low-impedance emitter 23 between the contact structures 5b and to form the contact structures 5b as a selective emitter. This drastically increases the efficiency of the semiconductor component 1b.

The contact structure 5b can, of course, also be used on the rear side 4 of a p-doped semiconductor substrate 2; especially the combination of a rear-side contact with a contact structure 5b according to the fourth embodiment and the semiconductor component 1 according to one of the previous embodiments is conceivable.

Figure 6:
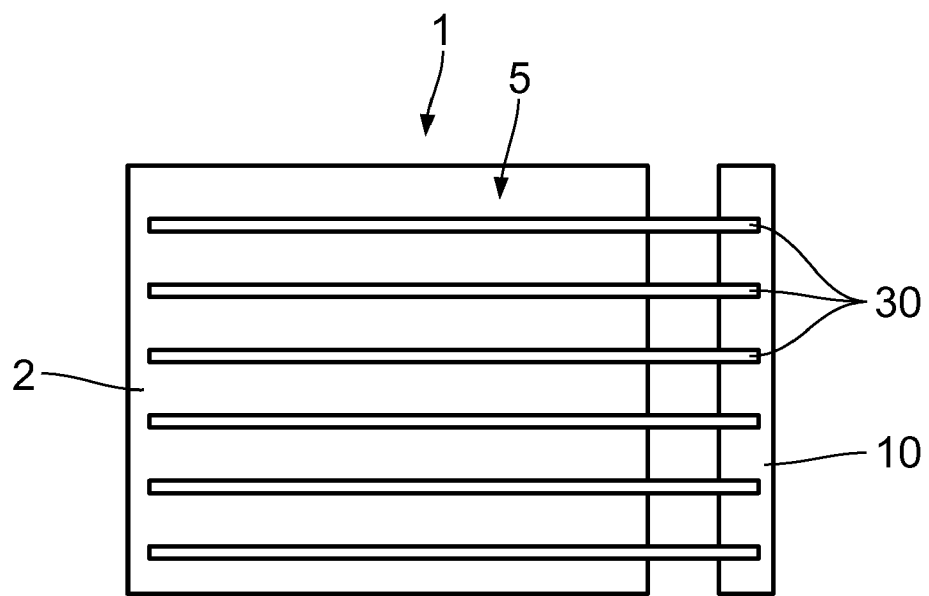

In the following, a fifth embodiment of the invention is described with reference to FIGS. 6 to 8. Identical parts receive the same reference number as for the embodiment according to FIG. 1, reference to the description of which is hereby made. According to this embodiment, the wires 30 of the contact structure 5 protrude in the direction parallel to the front side 3 sideways from semiconductor substrate 2. They are electrically connected, for example soldered or glued with a conductive glue, to a metal strip 10 forming a cross connection. The metal strip 10 is especially made of copper. It forms a contact strip, which may be used to electrically interconnect several, especially neighbouring semiconductor components 1. The metal strip 10 also serves as a busbar to cross-connect the wires 30 of the contact structure 5.

The connection of the contact structure 5 with the metal strip 10 is preferably carried out after the alloying-in of the contact structure 5 into the semiconductor substrate 2.

Figure 7:
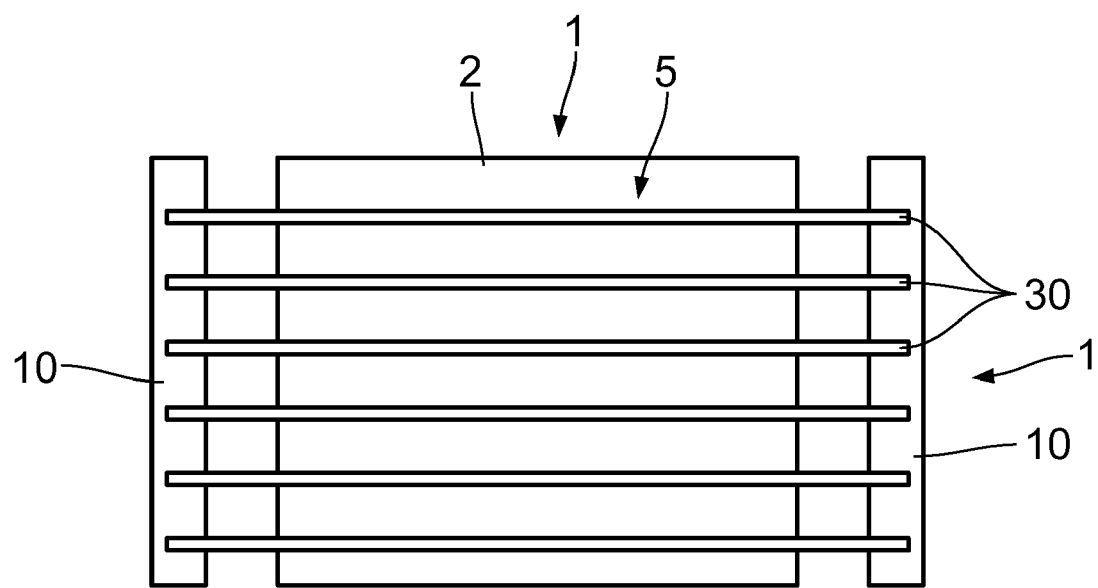

On the embodiment according to FIG. 7 the contact structure 5 protrudes in the direction parallel to front side 3 on both sides from the semiconductor substrate 2. Accordingly, there are envisaged two metal strips 10 lying opposite to each other with respect to the semiconductor component 1, which are in electrical contact with the contact structure 5.

Figure 8:
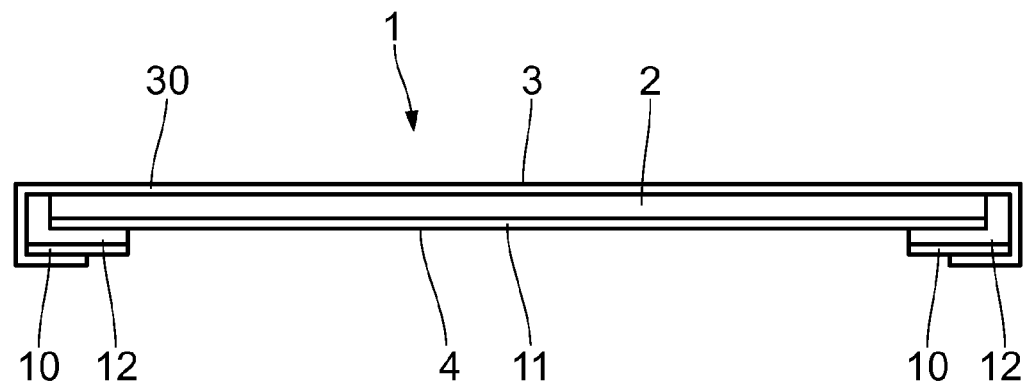

On the embodiment according to FIG. 8 the contact structure 5 protrudes in the direction parallel to the front side 3, also on both sides, from the semiconductor substrate 2, and is in each case electrically conductively connected with one metal strip 10. On this embodiment, however, the part of the contact structure 5 protruding from the semiconductor substrate 2 is bent back by 180°, and the metal strips 10 are arranged on the rear side 4 of the semiconductor component 1. The metal strips 10 are each isolated from a rear-side contact 11 of the semiconductor component 1 by an electrically isolating isolation layer 12.

In the following, a semiconductor module 13 is described with reference to FIG. 9. The semiconductor module 13 comprises several, especially at least two, semiconductor components 1 according to one of the previous embodiments, the contact structure 5 of one of the semiconductor components 1 being electrically conductively connected in each case with another of the semiconductor components 1, especially the neighbouring semiconductor component 1. The contact structure 5 is preferably electrically conductively connected in each case with the front side 3 of the one semiconductor component 1 and the rear side 4 of the neighbouring semiconductor component 1. However, it is also conceivable to connect with each other the front sides 3 and/or the rear sides 4 of neighbouring semiconductor components 1 by means of the contact structure 5.

Figure 12:
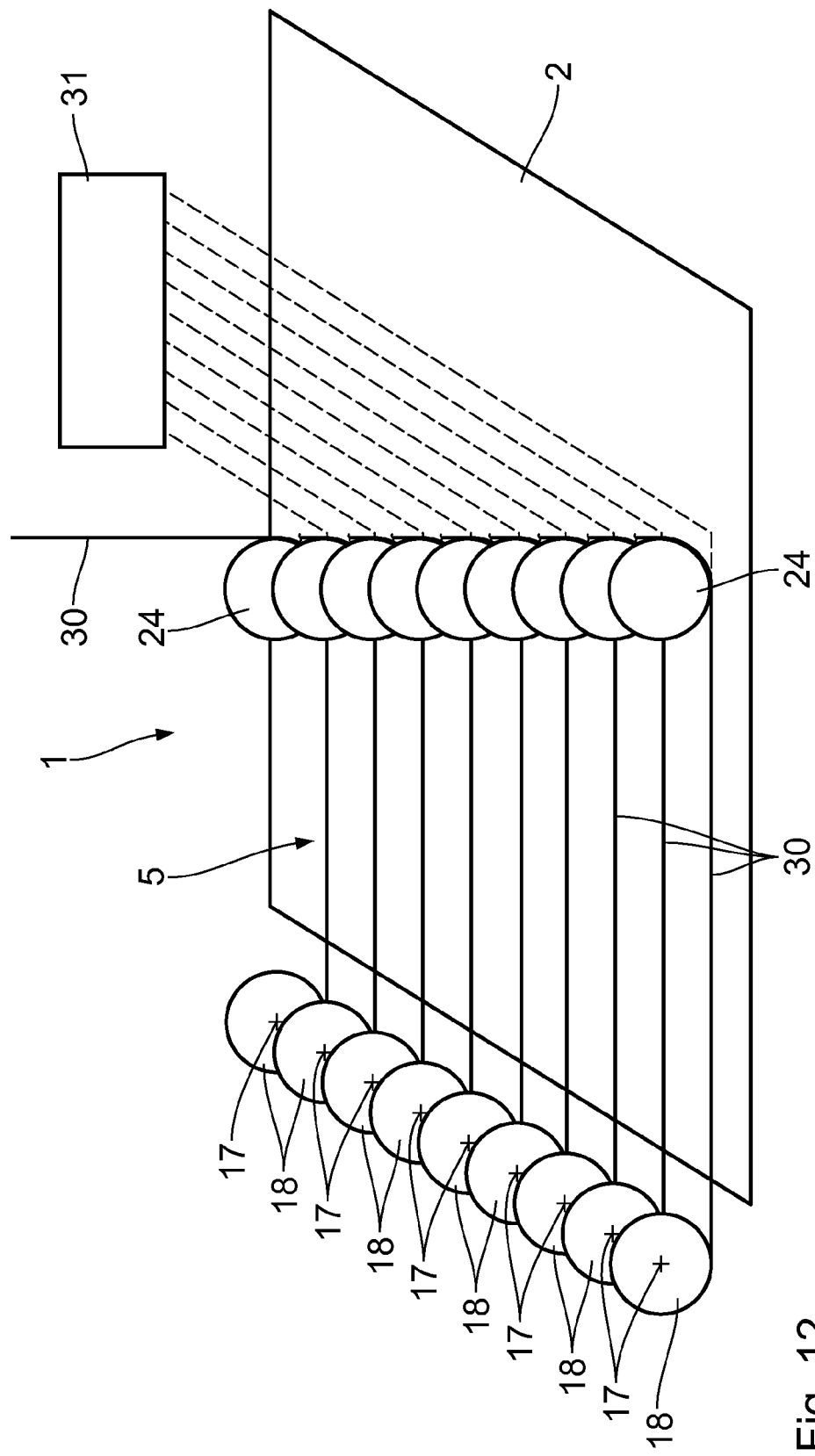
Figure 13:
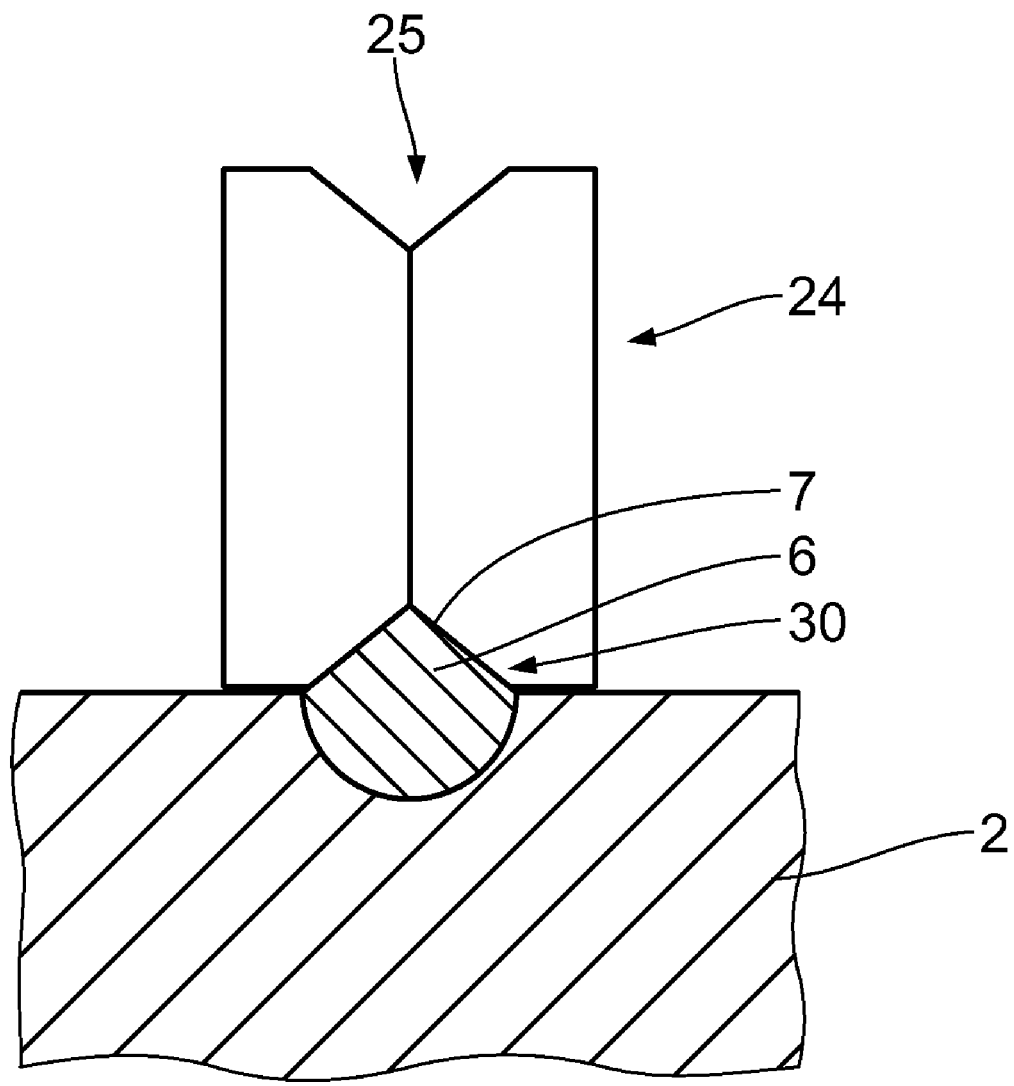

In the following, another method, according to the present invention, for manufacturing the semiconductor component 1 is described with reference to FIGS. 12 and 13. On this embodiment, instead of the meander-shaped arrangement of the contact structure 5 on the front side 3 of the semiconductor substrate 2, a plurality of wires 30, which form the contact structure 5, are each unrolled from their own roller 18. The rollers 18 advantageously exhibit a common rotational axis 17.

The pressing-on of the wires 30, which form the contact structure 5, onto the semiconductor substrate 2 occurs in each case with a pressing-on roller 24. To achieve a contact structure 5 with a triangular cross-section according to the embodiment in FIG. 2, wires 30 already having a triangular cross-section in their original state can be used. However, the triangular cross-sectional shape is preferably created by plastic deformation of the wire 30 during the application thereof onto the semiconductor substrate 2, by which twisting of the wire 30 can be avoided. To generate the triangular cross-sectional shape, the pressing-on roller 24, which is designed as a profile roller, exhibits a cut-out 25 of a triangular cross-section, through which the wire 30 is guided and plastically deformed during the heating. In this way, the cross-section of the contact structure 5 can easily be predefined by the shape of the cut-out 25. During the pressing-on with the pressing-on roller 24 onto the semiconductor substrate 2, the part of the wire 30 protruding from the semiconductor substrate 2 receives a cross-section, which just corresponds to the cross-section of the cut-out 25.

With this method, too, the semiconductor component 1 is provided with the protective layer 8 after the application of the contact structure 5.

As an alternative thereto it is also possible to provide the semiconductor substrate 2 with the protective layer 8 before the application of the contact structure 5 and to open up the protective layer 8 by means of an etching process or through laser ablation, care being taken, according to the present invention, to ensure that the emitter 23 is not penetrated. In the case of laser ablation it is envisaged to work in a phosphorous-containing medium to create a locally highly doped emitter 23.

Preferably, the laser beam produced by an appropriate laser 31 to open up the protective layer 8 is directly guided in front of the wire 30 pressed onto the semiconductor substrate 2 by means of the pressing-on roller 24. For this method, the formation of the alloy from the diffusion barrier 7 or the coating 22 with the material of the semiconductor substrate 2 occurs advantageously by means of the residual heat of the laser opening process. However, it is equally possible to initiate the alloying process between diffusion barrier 7 and the semiconductor substrate 2 through subsequent heating by means of a flash lamp, a tempering furnace or through conductive heating.

Figure 14:
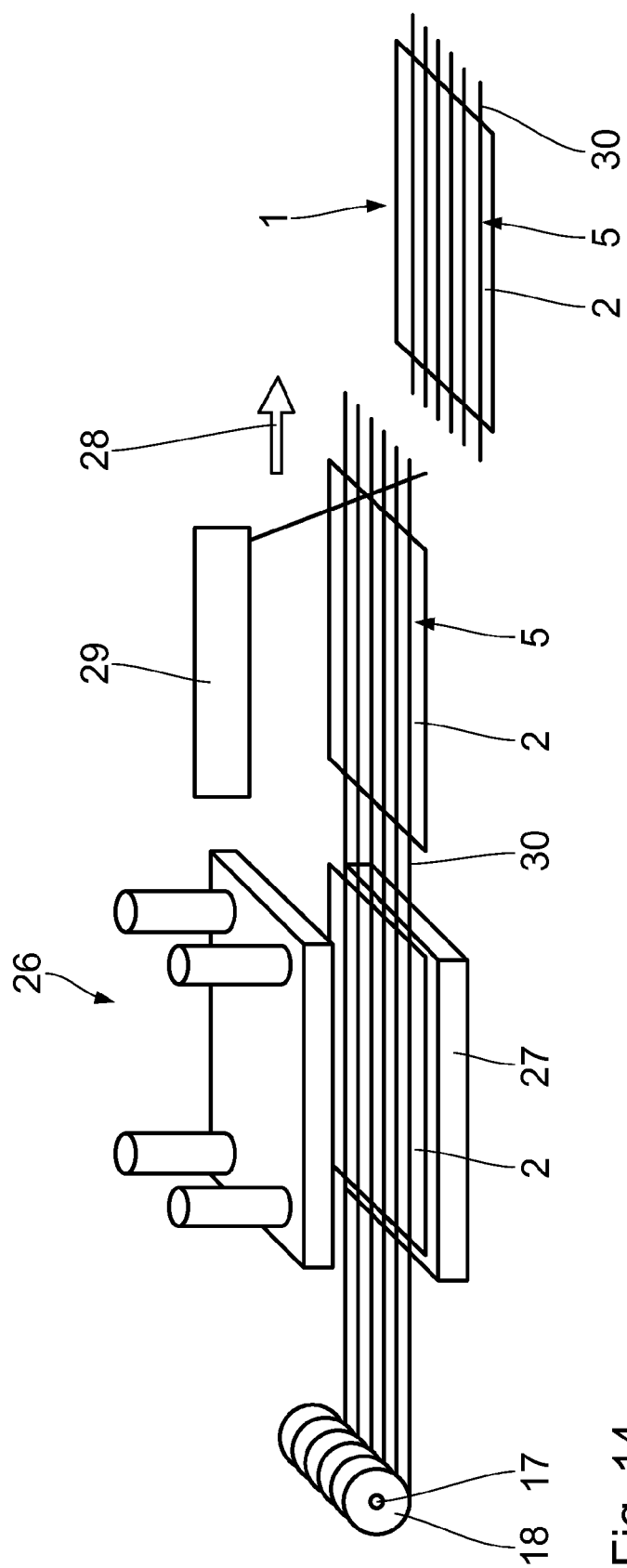

In the following, another method for manufacturing the semiconductor component 1 is described with reference to FIG. 14. The method essentially corresponds to the method according to FIGS. 12 and 13, reference to the description of which is hereby made. However, instead of the pressing-on rollers 24, a stamp 26 is envisaged, with which the wires 30 of the contact structure 5 unrolled from the rollers 18 are pressed onto the semiconductor substrate 2. As a counterpart to the stamp 26 there is envisaged a base plate 27. To apply the contact structure 5 onto the semiconductor substrate 2, the latter is placed on the base plate 27, the wires 30 of the contact structure 5 are arranged thereon and then pressed onto the semiconductor substrate 2 by means of the stamp 26, with the stamp 26 and/or the base plate 27 being heated. It is, of course, also possible to heat the wires 30 directly, for example conductively.

Next, the semiconductor component 1 is guided further along a transfer direction 28, through which the wires 30 are unrolled from the rollers 18. After the application of the contact structure 5 the wires 30 thereof a severed by means of a cutting device 29. However, this advantageously occurs only after the contact structure 5 has been arranged on the semiconductor substrate 2 to produce the next following semiconductor component 1 and fixed in place by the pressing of the stamp 26. The position of the contact structure 5 of the next following semiconductor component 1 is thus pre-defined in a simple way by that of its predecessor.

The stamp 26 preferably exhibits a soft coating, made, for example, of silicon, which is temperature-resistant up to the alloying temperature, $T_L$, to compensate unevenness and/or thickness variations of the semiconductor substrate. The stamp 26 can, of course, also be provided with cut-outs 25 for the plastic deformation of the wire 30 forming the contact structure 5.

What is claimed is:

1. A semiconductor component, especially a solar cell, comprising:
    a semiconductor substrate of a planar design having a first side and a second side lying opposite thereto;
    at least one contact structure arranged on at least one side of the semiconductor substrate, the at least one contact structure comprising a diffusion barrier to prevent the diffusion of ions from the contact structure into the semiconductor substrate, said at least one contact structure comprising a metal wire, said diffusion barrier being molten into said semiconductor substrate, at least in some areas, to form an alloy, said contact structure being connected to said semiconductor substrate via said alloy.

2. A semiconductor component according to claim 1, wherein said alloy is electrically conductive.

3. A semiconductor component according to claim 1, wherein the contact structure exhibits a line resistance of less than 20 Ω/m.

4. A semiconductor component according to claim 1, wherein the contact structure exhibits a line resistance of less than 10 Ω/m.

5. A semiconductor component according to claim 1, wherein the contact structure exhibits a line resistance of less than 3 Ω/m.

6. A semiconductor component according to claim 1, wherein the metal wire is a copper wire.

7. A semiconductor component according to claim 1, wherein the diffusion barrier exhibits at least one of cobalt or nickel or silver and antimony or a compound of said elements.

8. A semiconductor component according to claim 1, wherein the contact structure exhibits one of a round cross-section and a polygonal cross-section.

9. A semiconductor component according to claim 8, wherein the round cross-section is one of a circular cross-section and an elliptical cross-section.

10. A semiconductor component according to claim 1, wherein the contact structure is arranged in a recess in the semiconductor substrate, at least thirty percent of a cross-sectional surface area of said metal wire being arranged in said recess.

11. A semiconductor component according to claim 1, wherein the contact structure protrudes at least partially from the semiconductor substrate in a direction parallel to one of the sides thereof.

12. A semiconductor component in accordance with claim 1, wherein said diffusion barrier comprises an outer diffusion barrier surface, said outer diffusion barrier surface defining an outermost surface of said contact structure, at least a portion of said outer diffusion barrier surface engaging said semiconductor substrate.

13. A semiconductor component in accordance with claim 1, wherein said alloy is arranged between said diffusion barrier and said semiconductor substrate.

14. A semiconductor component in accordance with claim 1, wherein said metal wire comprises a metallic core, said diffusion barrier engaging said metallic core.

15. A semiconductor module comprising:
    at least two semiconductor components, each of said at least two semiconductor components comprising a semiconductor substrate of a planar design having a first side and a second side lying opposite thereto and at least one contact structure arranged on at least one side of the semiconductor substrate, the at least one contact structure comprising a diffusion barrier to prevent the diffusion of ions from the contact structure into the semiconductor substrate, said at least one contact structure comprising a metal wire, said diffusion barrier being molten into said semiconductor substrate, at least in some areas, to form an alloy, said contact structure being connected to said semiconductor substrate via said alloy, the at least two semiconductor components being electrically connected by means of at least one of the contact structures.

16. A semiconductor module in accordance with claim 15, wherein said diffusion barrier comprises an outer diffusion barrier surface, said outer diffusion barrier surface defining an outermost surface of said contact structure, at least a portion of said outer diffusion barrier surface engaging said semiconductor substrate.

17. A semiconductor module in accordance with claim 15, wherein said alloy is arranged between said diffusion barrier and said semiconductor substrate.

18. A semiconductor module in accordance with claim 15, wherein said metal wire comprises a metallic core, said diffusion barrier engaging said metallic core.

19. A semiconductor component, especially a solar cell, comprising:
   a planar semiconductor substrate comprising a first side and a second side, said second side being opposite said first side;
   a contact structure arranged on at least one of said first side and said second side, said contact structure comprising a metallic diffusion barrier, wherein ions do not diffuse from said contact structure into the semiconductor substrate via said diffusion barrier, said at least one contact structure comprising a metal wire, said diffusion barrier comprising a diffusion barrier molten portion;
   an alloy arranged between said contact structure and said planar semiconductor substrate, said alloy comprising at least said diffusion barrier molten portion, said planar semiconductor substrate being connected to said contact structure via said alloy, said alloy engaging said diffusion barrier and said planar semiconductor substrate.

20. A semiconductor module in accordance with claim 19, wherein said diffusion barrier comprises an outer diffusion barrier surface, said outer diffusion barrier surface defining an outermost surface of said contact structure, at least a portion of said outer diffusion barrier surface engaging said semiconductor substrate, said metal wire comprising a metallic core, said diffusion barrier engaging said metallic core, said semiconductor substrate comprising a molten semiconductor substrate portion, said alloy comprising said molten semiconductor substrate portion.

* * * * *